(12) United States Patent
Stengel et al.

(10) Patent No.: US 6,198,348 B1
(45) Date of Patent: Mar. 6, 2001

(54) DIFFERENTIAL CIRCUIT WITH REVERSE ISOLATION

(75) Inventors: Robert E. Stengel, Pompano Beach; David E. Bockelman, Weston, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/346,032

(22) Filed: Jul. 1, 1999

Related U.S. Application Data

(60) Provisional application No. 60/111,172, filed on Dec. 7, 1998.

(51) Int. Cl.$^7$ ........................................................ H03F 3/45
(52) U.S. Cl. .................................................................. 330/252
(58) Field of Search ................................... 330/252, 261, 330/295, 253, 254; 327/359

(56) References Cited

U.S. PATENT DOCUMENTS

| 3,803,503 | 4/1974 | Greutman | 330/263 |
| 3,835,406 | 9/1974 | Thompson | 330/277 |
| 4,692,712 | 9/1987 | Quinn | 330/261 |
| 4,914,400 | * 4/1990 | Kobayashi et al. | 330/252 |
| 5,355,095 | 10/1994 | Nathanson et al. | 330/264 |
| 5,821,824 | * 10/1998 | Mentzer | 330/295 X |

* cited by examiner

*Primary Examiner*—Steven J. Mottola
(74) *Attorney, Agent, or Firm*—Andrew S. Fuller

(57) ABSTRACT

A differential circuit (200) provides for reverse isolation between input and output ports (202, 204). The differential circuit has amplification circuitry that includes active transistors (221, 222) and reverse isolation circuitry that employ transistors (223,224) having similar manufacturing and processing characteristics to couple the input and output ports (202, 204).

16 Claims, 3 Drawing Sheets

US 6,198,348 B1

DIFFERENTIAL CIRCUIT WITH REVERSE ISOLATION

CROSS REFERENCE

This application claims the benefits of U.S. Provisional Application No. 60/111,172 filed Dec. 7, 1998 and assigned to Motorola, Inc.

TECHNICAL FIELD

This invention relates in general to differential amplifiers, and more particularly, to reverse isolation in differential amplification circuitry.

BACKGROUND OF THE INVENTION

Circuit designers are increasingly turning to differential circuitry as a means of enhancing performance in radio circuitry. Differential amplifiers and mixers are an integral part of such circuitry, and are used in such radio applications as direct conversion receivers. For example, a direct conversion receiver may use an amplifier to amplify a received signal prior to signal processing. The amplifier is generally designed to produce a gain in a forward path with little or no reverse leakage. Reverse leakage is an unintended consequence of particular amplifier designs, and can lead to such problems as circuit instability and radio interference.

It is desirable to have a differential amplifier in which reverse transmission is substantially reduced in order to improve circuit stability and to reduce the effects of interference in radio applications. Therefore, a differential amplifier with improved reverse isolation is needed.

DETAILED DESCRIPTION OF THE PREFERRED EMBODIMENT

Figure 1:
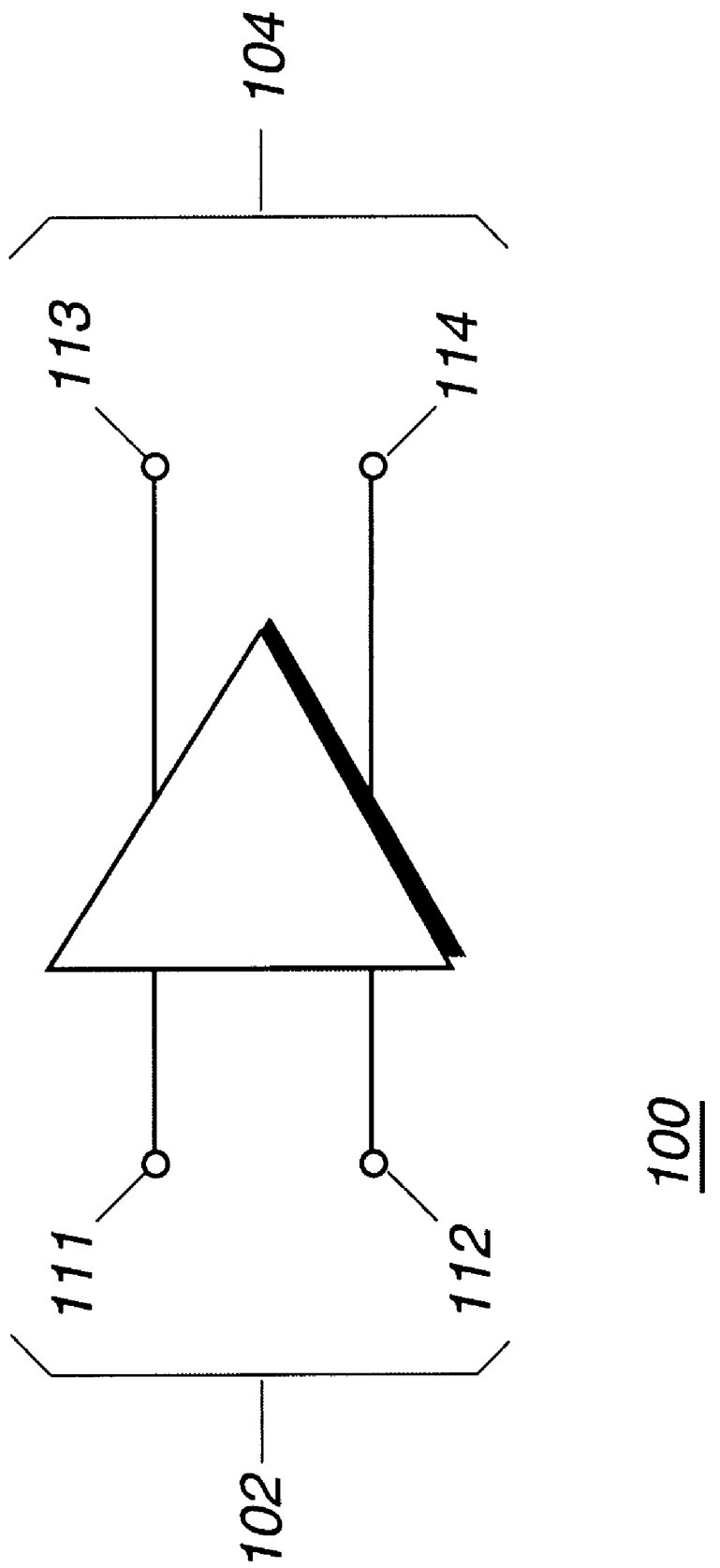
FIG. 1 is a block diagram of a differential amplifier having input and output ports, in accordance with the present invention.

While the specification concludes with claims defining the features of the invention that are regarded as novel, it is believed that the invention will be better understood from a consideration of the following description in conjunction with the drawing figures, in which like reference numerals are carried forward.

The present invention provides for improvement in reverse isolation for differential amplifiers, mixers, and similarly situated differential circuits. The inventors have discovered that, in a differential amplifier with amplification circuitry connecting a differential input port to a differential output port, the pure differential-mode reverse transmission from the output port to the input port can be neutralized by canceling the reverse gain through the gain devices with reverse cross-coupling using devices having similar characteristics. In the preferred embodiment, such reverse isolation circuitry includes passive transistors, i.e., transistors that are biased off, which have similar manufacturing and processing characteristics to the active transistors of the amplification circuitry, i.e., transistors used for gain purposes.

In developing the concepts behind the present invention, it is instructive to review some theoretical aspects concerning the transfer of signals between the ports of a differential device, and scattering parameters that describe signal transfer among terminals. FIG. 1 illustrates a differential amplifier circuit 100 having an input port 102 comprising two terminals 111, 112, and an output port 104 comprising two terminals 113, 114. For reference purposes, the input port 102 is referred to herein as Port 1, the two terminals 111, 112 as the first and second terminals, the output port 104 as Port 2, and the two terminals 113, 114 as the third and fourth terminals. In an ideal situation, an input signal presented at Port 1 is amplified by the differential amplifier 100 and the resulting amplified signal presented at Port 2. However, a major problem in many prior art amplifier designs is that there is reverse signal leakage through the amplification circuit, such that signals present at Port 2 are transmitted in a reverse manner through the amplifier to Port 1. Such input to output feedback can cause circuit instabilities. An amplifier behaves in a more unilateral fashion when reverse isolation is improved.

In a differential amplifier, one is most concerned with the pure differential mode reverse transmission occurring from Port 2 to Port 1. Such reverse transmission is designated herein as $S_{dd12}$, meaning the differential signal measured at Port 1 when a differential signal is presented at Port 2. The term $S_{dd12}$ can be related to single-ended four port S-parameters as a differential transfer function $S_{dd12}(f)$ representing differential signal transfer from the output port to the input port over frequency, f, such that:

$$S_{dd12}(f) = \tfrac{1}{2}(S_{13}(f) - S_{14}(f) - S_{23}(f) + S_{24}(f)),$$

where $S_{13}(f)$ is a scattering parameter representing reverse signal transfer from the third terminal to the first terminal; $S_{14}(f)$ is a scattering parameter representing reverse signal transfer from the fourth terminal to the first terminal; $S_{23}(f)$ is a scattering parameter representing reverse signal transfer from the third terminal to the second terminal; and $S_{24}(f)$ is a scattering parameter representing reverse signal transfer from the fourth terminal to the second terminal.

The inventors have determined that $S_{13}(f)$ and $S_{24}(f)$ are dominated by the reverse gain through the active devices of the amplification circuitry, while the terms $S_{14}(f)$ and $S_{23}(f)$ represent reverse cross-coupling and are generally very small. According to the invention, the reverse isolation circuitry is constructed to cause the sum of $S_{14}(f)$ and $S_{23}(f)$ to be equal to the sum of $S_{13}(f)$ and $S_{24}(f)$. In so doing, the differential reverse gain $S_{dd12}(f)$ should be approximately zero over a substantial frequency range, even though the reverse isolation of the active devices may not be zero. Preferably, $S_{23}(f)$ has a non-zero value (non-zero real and imaginary components that are a function of frequency) approximately equal to $S_{13}(f)$. Similarly, $S_{14}(f)$ has a non-zero value approximately equal to $S_{24}(f)$. In contrast, the effect of prior art design techniques has been to force $S_{13}(f)$ to be equal to $S_{24}(f)$, and to force $S_{14}(f)$ to be equal to $S_{23}(f)$ and to be as small as possible, but with no requirement for $S_{23}(f)$ to be equal to $S_{13}(f)$ and for $S_{14}(f)$ to be equal to $S_{24}(f)$. The present invention is particularly suitable for constructing differential amplifiers that operate at radio or microwave frequencies, such as frequencies ranging from 100 megahertz to 1 gigahertz or higher.

Figure 2:
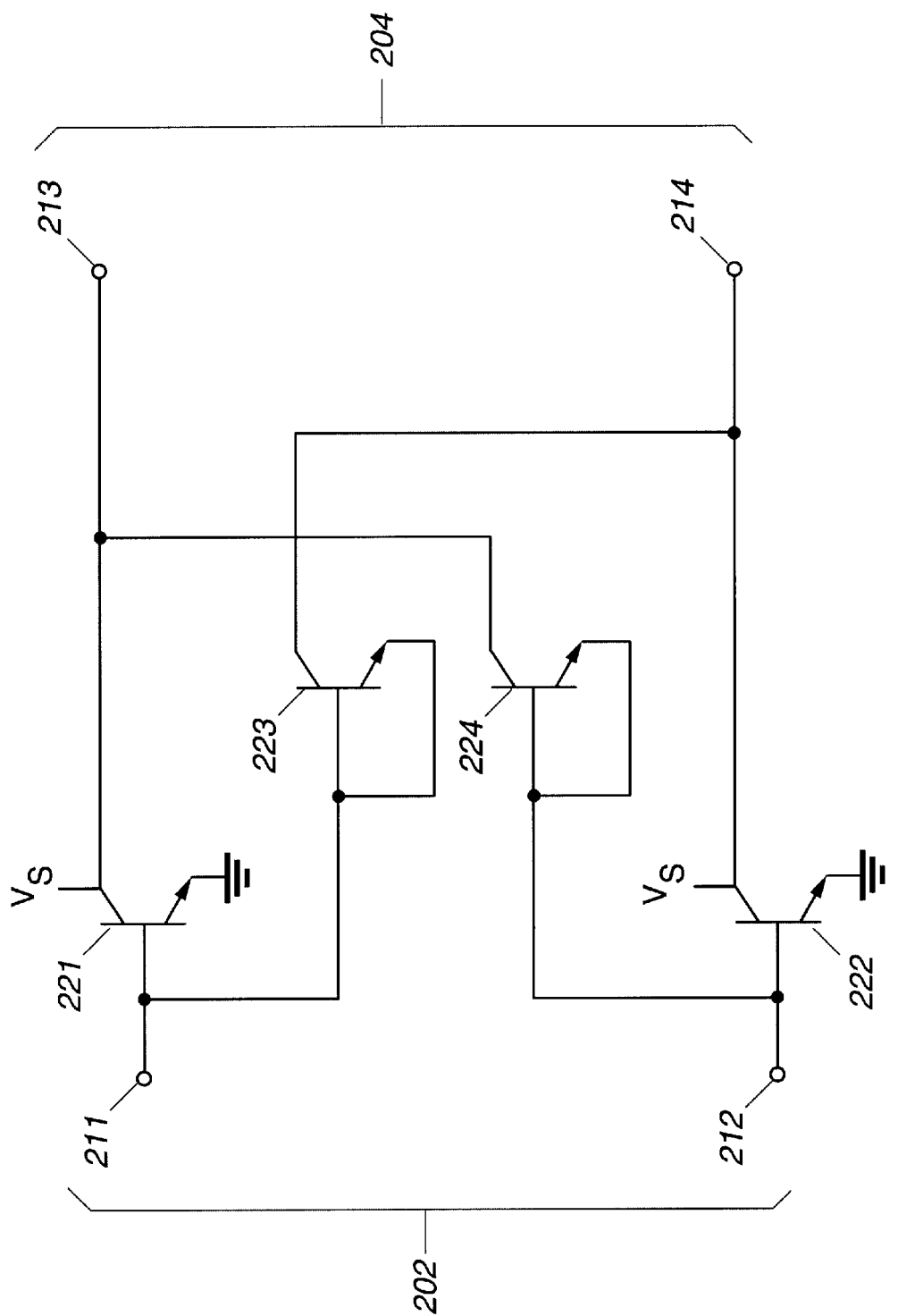
FIG. 2 is a schematic diagram of one embodiment of the differential amplifier, in accordance with the present invention.

FIG. 2 shows a schematic diagram of a differential amplifier 200 with reverse isolation constructed in accordance with present invention. The differential amplifier 200 includes amplification circuitry having a differential input port 202 and a differential output port 204. The amplification circuitry comprises transistors 221, 222 that function as gain devices. The input port 202 comprises two terminals 211, 212 that are respectively coupled to provide input to the transistors 221, 222. The output port 204 includes two output terminals 213, 214 that are coupled to the output of the transistors 221, 222. In a normal operating mode, the transistors 221, 222 are biased on and are supplied by independent high impedance direct current voltage supplies, $V_S$. In the preferred embodiment, the transistors 221, 222 are NPN bipolar transistors having their bases coupled to the input terminals 211, 212, respectively, their collector nodes coupled to the supply and to the output terminals 213, 214, and their emitter nodes coupled to electrical ground.

According to the present invention, the differential amplifier 200 includes reverse isolation circuitry that couples the differential output port 204 to the differential input port 202. The reverse isolation circuitry includes transistors 223, 224 having similar manufacturing and processing characteristics to the gain transistors 221, 222 in the amplification circuitry, such as would occur if implemented on a single silicon wafer or a single integrated circuit. In the preferred embodiment, the transistors 223, 224 are NPN bipolar transistors, similar to those used in the amplification circuitry. These transistors are biased off and therefore function as passive transistors, i.e., it is their reverse coupling characteristics that are used, rather than their forward gain characteristics. When the transistor 223, 224 is biased off, its reverse scattering parameter is equal to its forward scattering parameter. However, the only characteristic used is that of the reverse scattering parameter being constrained to be equal to the active transistor reverse scattering parameter. Its not a requirement that the reverse and forward scattering parameters are equal. The forward scattering parameter should be much smaller than the active transistor forward scattering parameter.

Transistor 223 has its base coupled to the input terminal 211 and to the input of the transistor 221, its emitter node coupled to its base, and its collector coupled to the output terminal and to the output of transistor 222. Similarly, transistor 224 has its base coupled to the input terminal 212 and to the input of the transistor 222, its emitter node coupled to its base, and its collector node coupled to the output terminal 213 and to the output of transistor 221.

Thus, in the preferred embodiment, identical transistors that generate gain in the amplification circuitry are used to generate feed forward branches across the amplification transistors, such that the feed forward branches have transmission coefficients equal to the reverse gain of the amplification transistors when viewed in a single-ended manner. It is noteworthy that these feed forward transistors 223, 224 are biased off so that they have very little forward gain. With these transistors biased off, the forward gain (or loss) is approximately equal to its reverse gain. Significantly, the forward gain of the transistors biased off is approximately equal to the reverse gain of a forward biased transistor. This approximation produces a differential amplifier having significantly reduced reverse gain.

Figure 3:
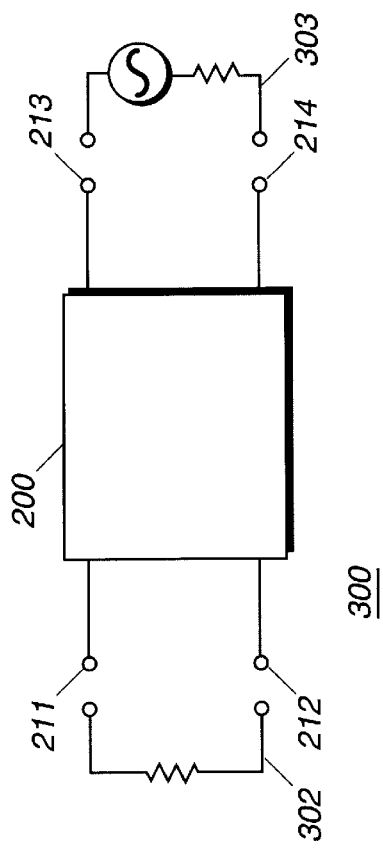
FIGS. 3 and 4 are a block diagram of a radio communication device, in accordance with the present invention.
Figure 4:
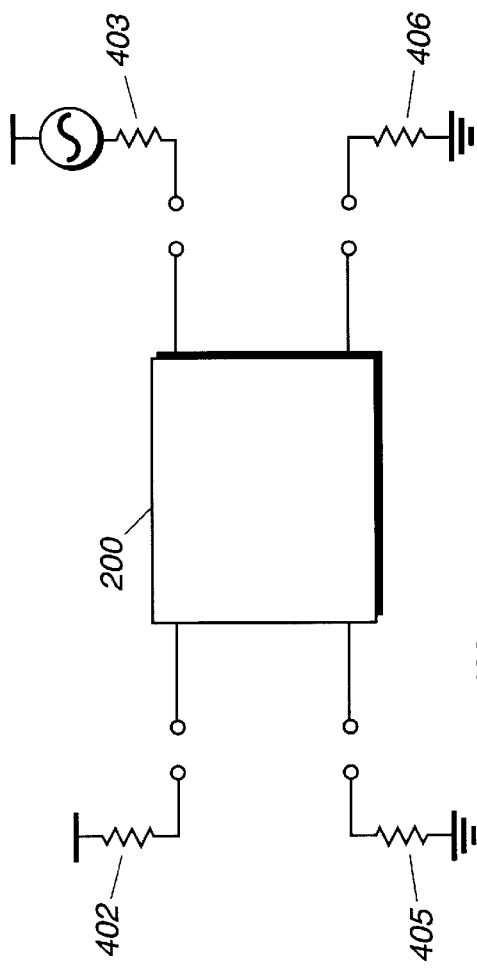

FIG. 3 is a block diagram of a radio communication device 300, in accordance with the present invention. The radio 300 is operable in a transmit mode and a receive mode to communicate over radio frequency channels. In receive mode, an antenna switch 304 couples a communication signal received by an antenna 302 to a transformer 312. The transformer converts the single-ended communication signal into a differential signal. The output of the transformer 312 is presented to a differential amplifier 314 (sometimes referred to as a pre-amplifier), which amplifies the signal to be processed by receiver circuitry 316. Such operation is under the control of radio control circuitry 330. In transmit mode, transmitter circuitry 326 prepares signals which are amplified by a differential amplifier 324. A transformer 322 converts the differential signal that is outputted from the amplifier 324, and outputs a signal that is coupled through the antenna switch 304 to be radiated by the antenna 302.

According to the present invention, the pre-amplifier 314 is constructed as described with respect to FIG. 2 to reduce the likelihood that signals generated in the receiver circuitry pass in a reverse direction through the pre-amplifier 314 to be radiated out of the antenna 302, thereby causing interference. The amplifier 324 is similarly constructed to provide improved reverse isolation, thereby promoting circuit stability.

The present invention provides significant advantages over the prior art. Improved signal isolation of input and output ports of an amplifier eliminates impedance interaction between input and output ports. Thus, the input and output have independent power matching at all frequencies. With $S_{dd12}(f)$ equal to or approximating zero, an amplifier will be stable for all reactive impedance termination with positive real values on input and output ports, over a very broad range of frequencies. The use of devices similar to the active devices for reverse isolation purposes provides this condition, i.e., $S_{dd12}(f)$ being equal to or approximating zero, over a broad frequency range, with good tolerance for manufacturing and environmental variations.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A differential circuit, comprising:

first and second active transistors, each having an input and an output; and first and second passive transistors, the first and second passive transistors being biased off, wherein the first passive transistor has an input coupled to the input of the first active transistor, and has an output coupled to the output of the second active transistor, and wherein the second passive transistor has an input coupled to the input of the second active transistor, and has an output coupled to the output of the first active transistor.

2. The differential circuit of claim 1, wherein the first and second active transistors, and the first and second passive transistors, all have similar manufacturing and processing characteristics.

3. A differential amplifier, comprising:

amplification circuitry having a differential input port and a differential output port, and comprising first and second transistors; and reverse isolation circuitry that couple the differential output port to the differential input port, and comprising third and fourth transistors that are identical to the first and second transistors and that have similar manufacturing and processing characteristics to the first and second transistors;

wherein the first and second transistors are active transistors, and the third and fourth transistors are passive transistors.

4. A differential amplifier, comprising:

amplification circuitry having a differential input port and a differential output port, and comprising first and second transistors;

reverse isolation circuitry that couple the differential output port to the differential input port, and comprising third and fourth transistors having similar manufacturing and processing characteristics to the first and second transistors; and wherein the first and second transistors are biased on, and the third and fourth transistors are biased off.

5. The differential amplifier of claim 2, wherein:

the differential input port comprises first and second terminals that provide input to the first and second transistors, respectively;

the differential output port comprises third and fourth terminals that provide output from the first and second transistors, respectively;

the third transistor has an input coupled to first terminal and an output coupled to the fourth terminal; and the fourth transistor has an input coupled to second terminal and an output coupled to the third terminal.

6. The differential amplifier of claim 5, wherein the third and fourth transistors are transistors that are biased off.

7. The differential amplifier of claim 5, wherein the amplification circuitry has a differential transfer function $S_{dd12}(f)$ representing differential signal transfer from the output differential port to the input differential port over frequency, f, such that:

$$S_{dd12}(f)=\tfrac{1}{2}(S_{13}(f)-S_{14}(f)-S_{23}(f)+S_{24}(f)),$$

where:

$S_{13}(f)$ is a scattering parameter representing reverse signal transfer from the third terminal to the first terminal;

$S_{14}(f)$ is a scattering parameter representing reverse signal transfer from the fourth terminal to the first terminal;

$S_{23}(f)$ is a scattering parameter representing reverse signal transfer from the third terminal to the second terminal;

$S_{24}(f)$ is a scattering parameter representing reverse signal transfer from the fourth terminal to the second terminal;

$S_{13}(f)$ has a non-zero value approximately equal to $S_{23}(f)$; and $S_{14}(f)$ has a non-zero value approximately equal to $S_{24}(f)$.

8. A differential circuit, comprising:

amplification circuitry having an input port comprising first and second terminals and an output port comprising third and fourth terminals;

wherein the amplification circuitry has a differential transfer function $S_{dd12}(f)$ representing differential signal transfer from the output port to the input port over frequency, f, such that:

$$S_{dd12}(f)=\tfrac{1}{2}(S_{13}(f)-S_{14}(f)-S_{23}(f)+S_{24}(f)),$$

where:

$S_{13}(f)$ is a scattering parameter representing reverse signal transfer from the third terminal to the first terminal;

$S_{14}(f)$ is a scattering parameter representing reverse signal transfer from the fourth terminal to the first terminal;

$S_{23}(f)$ is a scattering parameter representing reverse signal transfer from the third terminal to the second terminal;

$S_{24}(f)$ is a scattering parameter representing reverse signal transfer from the fourth terminal to the second terminal;

$S_{13}(f)$ has a non-zero value approximately equal to $S_{23}(f)$; and $S_{14}(f)$ has a non-zero value approximately equal to $S_{24}(f)$, and wherein $S_{dd12}(f)$ is approximately zero over a substantial frequency range.

9. The differential circuit of claim 8, wherein $S_{13}(f)$ and $S_{14}(f)$ have non-zero real and imaginary components.

10. The differential circuit of claim 8, wherein frequency, f, is at least 100 megahertz.

11. The differential circuit of claim 8, wherein $S_{dd12}(f)$ is approximately zero over a substantial frequency range.

12. The differential circuit of claim 8, wherein the amplification circuitry comprises first and second transistors, further comprising reverse isolation circuitry that couple the output port to the input port, and comprising third and fourth transistors having similar manufacturing and processing characteristics to the first and second transistors.

13. A radio communication device, comprising:

an antenna;

communication circuitry coupled to the antenna, the communication circuitry comprising:

amplification circuitry having an input port comprising first and second terminals and an output port comprising third and fourth terminals;

reverse isolation circuitry coupling the output port to the input port and providing differential signal transfer over frequency, f, from the output port to the input port such that:

$S_{13}(f)-S_{14}(f)-S_{23}(f)+S_{24}(f)$ is approximately zero, where:

$S_{13}(f)$ is a scattering parameter representing reverse signal transfer from the third terminal to the first terminal;

$S_{14}(f)$ is a scattering parameter representing reverse signal transfer from the fourth terminal to the first terminal;

$S_{23}(f)$ is a scattering parameter representing reverse signal transfer from the third terminal to the second terminal;

$S_{24}(f)$ is a scattering parameter representing reverse signal transfer from the fourth terminal to the second terminal.

14. The radio communication device of claim 13, wherein:

$S_{13}(f)$ has a non-zero value approximately equal to $S_{23}(f)$; and $S_{14}(f)$ has a non-zero value approximately equal to $S_{24}(f)$.

15. The radio communication device of claim 14, wherein $S_{13}(f)$ and $S_{14}(f)$ have non-zero real and imaginary components that are a function of frequency.

16. The radio communication device of claim 13, wherein the amplification circuitry comprises first and second transistors that are biased on, and the reverse isolation circuitry comprises third and fourth transistors that are biased off.

* * * * *